(12) United States Patent
Gans et al.

(10) Patent No.: US 10,796,746 B2
(45) Date of Patent: *Oct. 6, 2020

(54) FREQUENCY SYNTHESIS FOR MEMORY INPUT-OUTPUT OPERATIONS

(71) Applicant: MICRON TECHNOLOGY, INC., Boise, ID (US)

(72) Inventors: Dean Gans, Nampa, ID (US); Moo Sung Chae, Boise, ID (US); Daniel Skinner, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

This patent is subject to a terminal disclaimer.

(21) Appl. No.: 16/138,621

(22) Filed: Sep. 21, 2018

(65) Prior Publication Data

US 2019/0027208 A1 Jan. 24, 2019

Related U.S. Application Data

(63) Continuation of application No. 15/415,655, filed on Jan. 25, 2017, now Pat. No. 10,115,449, which is a continuation of application No. 14/707,878, filed on May 8, 2015, now Pat. No. 9,601,182.

(51) Int. Cl.
| | | |
|---|---|---|
| *G11C 11/4076* | (2006.01) | |
| *G11C 11/4096* | (2006.01) | |
| *G11C 7/22* | (2006.01) | |
| *G11C 11/4093* | (2006.01) | |
| *G11C 7/10* | (2006.01) | |
| *G11C 7/14* | (2006.01) | |
| *G11C 7/06* | (2006.01) | |

(52) U.S. Cl.
CPC .......... *G11C 11/4076* (2013.01); *G11C 7/222* (2013.01); *G11C 11/4093* (2013.01); *G11C 11/4096* (2013.01); *G11C 7/062* (2013.01); *G11C 7/1006* (2013.01); *G11C 7/14* (2013.01); *G11C 2207/2254* (2013.01)

(58) Field of Classification Search
CPC ............ G11C 11/4076; G11C 11/4093; G11C 11/4096; G11C 7/222; G11C 7/062; G11C 7/1006; G11C 7/14
USPC ..................... 365/189.17, 233.1, 222, 189.05
See application file for complete search history.

(56) References Cited

U.S. PATENT DOCUMENTS

| | | |
|---|---|---|
| 5,896,347 A | 4/1999 | Tomita et al. |
| 6,052,328 A | 4/2000 | Ternullo, Jr. et al. |
| 7,170,818 B2 | 1/2007 | Kyung |

(Continued)

*Primary Examiner* — Connie C Yoha
(74) *Attorney, Agent, or Firm* — Dorsey & Whitney LLP (57) ABSTRACT

A memory channel including an internal clock circuit is disclosed. The clock circuit may synthesize an internal clock signal for use by one or more components of the memory channel. The internal clock signal may have a different frequency than an external clock frequency. The memory channel may include multiple clock circuits that generate multiple internal clock signals. Each portion of the memory channel associated with a different clock circuit may be phase and/or frequency independent of the other portions of the memory channel. The clock circuit may synthesize an internal clock signal based on an external clock signal. The clock circuit may use encoded timing data from an encoded I/O scheme to align the phase of the internal clock signal to a data signal.

20 Claims, 7 Drawing Sheets

(56) References Cited

U.S. PATENT DOCUMENTS

| | | | |
|---|---|---|---|
| 9,601,182 B2* | 3/2017 | Gans | G11C 11/4076 |
| 2007/0133332 A1* | 6/2007 | Chun | G11C 7/1072 |
| | | | 365/222 |
| 2009/0116598 A1* | 5/2009 | Kim | G11C 7/1066 |
| | | | 375/360 |
| 2011/0179210 A1 | 7/2011 | Matano | |
| 2011/0193590 A1 | 8/2011 | Nakagawa et al. | |
| 2011/0227618 A1 | 9/2011 | Miyano | |
| 2012/0300568 A1 | 11/2012 | Park et al. | |
| 2015/0372683 A1 | 12/2015 | Takahashi | |
| 2016/0329090 A1 | 11/2016 | Gans et al. | |
| 2017/0133080 A1 | 5/2017 | Gans et al. | |
| 2019/0163653 A1* | 5/2019 | Kim | G11C 29/023 |

\* cited by examiner

FREQUENCY SYNTHESIS FOR MEMORY INPUT-OUTPUT OPERATIONS

CROSS REFERENCE TO RELATED APPLICATION(S)

This application is a continuation of U.S. patent application Ser. No. 15/415,655, filed Jan. 25, 2017, and issued as U.S. Pat. No. 10,115,449 on Oct. 30, 2018, which is a continuation of U.S. patent application Ser. No. 14/707,878, filed May 8, 2015, and issued as U.S. Pat. No. 9,601,182 on Mar. 21, 2017. The aforementioned applications and patents are incorporated herein by reference, in their entirety, for any purposes.

BACKGROUND

Synchronous dynamic random access memory (SDRAM) allows commands to arrive at the memory at defined intervals. The intervals are typically defined by a clock signal. For example, an interval may be one or more clock cycles or a fraction of a clock cycle. The commands may arrive at a specific time in the clock cycle during the interval, for example, on rising and/or falling clock edges. Similarly, output data provided by the memory may be driven to a data bus at defined intervals and/or at a specific time in the clock cycle. The synchronization of command inputs and data outputs with a clock signal may improve predictability of event timing and reliable operation of the memory.

Typically, SDRAM receives an external clock signal (e.g. "the system clock signal"). The SDRAM may include an internal clock circuit that produces an internal clock signal based on the external clock signal. The internal clock signal may be used to synchronize internal SDRAM operations with the external clock signal. For example, the internal clock signal may adjust when output data and/or an output data strobe is provided on the data bus from the memory so that the output data is provided more closely to a clock edge of the external clock signal. As a result, the output data from the memory may be more reliably latched.

A delay-lock loop (DLL) or a phase-lock loop (PLL) may be used in the internal clock circuit to generate the internal clock signal from the external clock signal. A DLL adds an appropriate delay to the external signal to produce the internal clock signal to synchronize memory input/output (I/O) operations. A PLL phase-matches the external clock signal and the internal clock signal.

In some applications, it may be desirable to have a high frequency internal clock signal. This may allow certain memory operations to be performed at a higher rate. However, increasing the internal clock signal may require increasing the external clock signal, which may be detrimental to operations performed by the host. Increasing the frequency of the internal clock signal may increase the memory's power requirements. For example, distributing the clock signal throughout the memory via widespread high-speed clock trees requires more power as the clock signal frequency increases. Increased power consumption may be undesirable in some applications.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
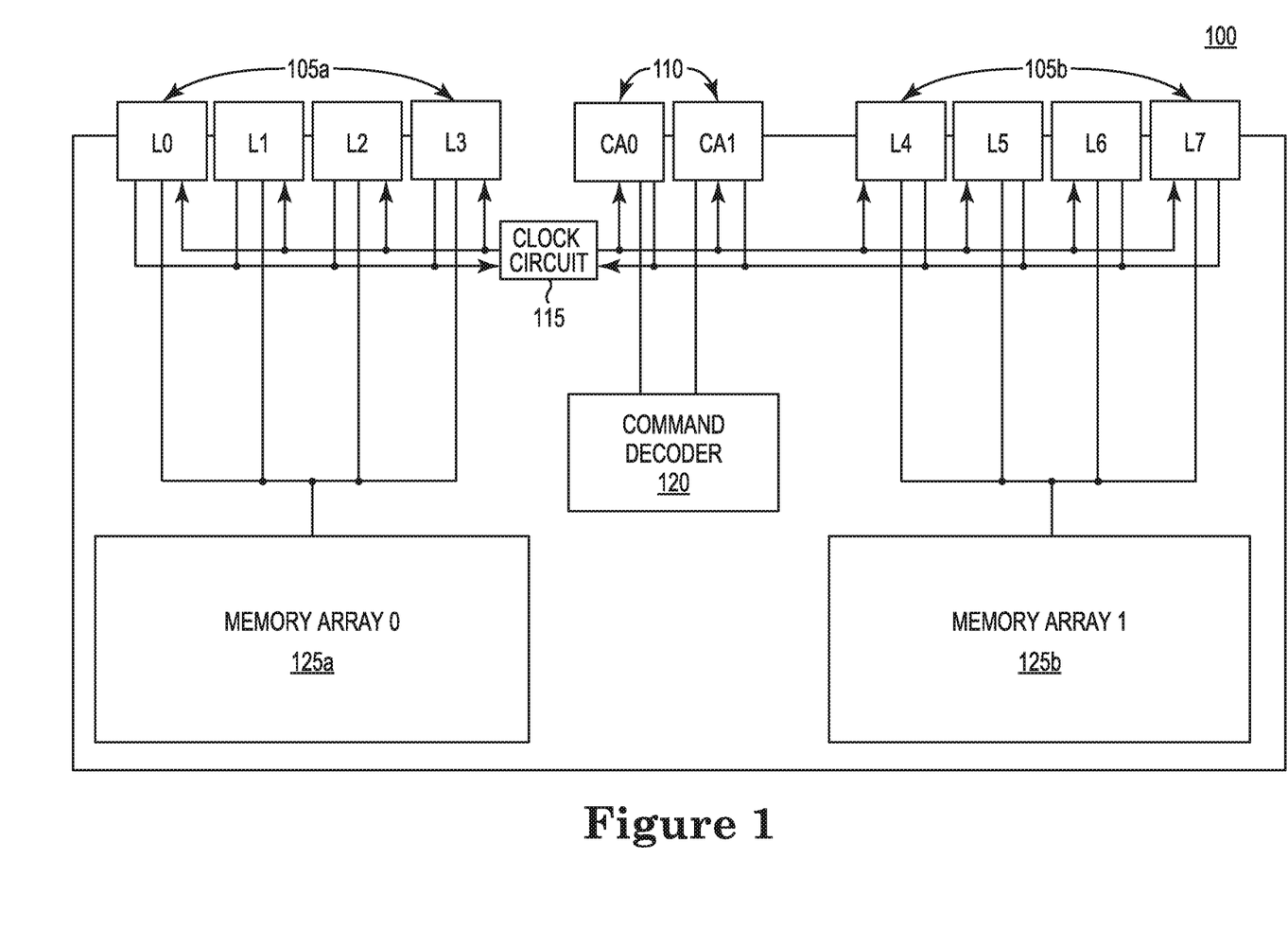
FIG. 1 is a block diagram of a memory channel according to an embodiment of the disclosure.

FIG. 1 is a block diagram of a memory channel 100 according to an embodiment of the disclosure. The memory channel 100 may be included in a memory device, for example, a SDRAM device. The memory channel 100 may be a single channel or a single channel of a multi-channel memory architecture. The memory channel 100 may include one or more command/address (CA) lanes 110. Each lane CA0, CA1 may include one or more signal lines for input of address and/or command signals. In some examples, each lane CA0, CA1 includes three signal lines. The signal lines may be capable of providing signals at two or more logic levels. Although two CA lanes 110 are illustrated in FIG. 1, greater or fewer CA lanes may be present in some embodiments. Each CA lane CA0, CA1 may include a receiver for each signal lane. The CA lanes 110 may be coupled to a command decoder 120. The command decoder 120 may decode commands and memory addresses for use by the memory channel 100.

The memory channel 100 may include a plurality of input/output (I/O) lanes 105a-b. Each I/O lane [L0-7] may include one or more signal lines for input and output of data signals. In some examples, each I/O lane [L0-7] may include three signal lines. The signal lines may be capable of providing signals at two or more logic levels. Although eight I/O lanes are illustrated in FIG. 1, greater or fewer I/O lanes may be present in some embodiments. In some embodiments, an encoded I/O scheme may be utilized. An encoded I/O scheme may encode data to provide periodic transitions between logic levels in the data signal. The periodic transitions may be timing information encoded with the data. An example of an encoded I/O scheme is the 8b/10b encoding used in serial ATA (SATA). However, other encoded I/O schemes may be used.

Each I/O lane [L0-7] may include a driver and a receiver for each signal line. Each I/O lane [L0-7] may include an encoder/decoder to encode outgoing data and decode incoming data from the signal lines. The I/O lanes 105a-b may be coupled to one or more memory arrays 125a-b. In some examples, each memory array 125a-b includes eight half-memory banks. As shown in FIG. 1, in some embodiments, a portion of the I/O lanes 105a may be coupled to the memory array 125a, and another portion of the I/O lanes 105b may be coupled to the memory array 125b. In some embodiments, memory arrays 125*a*-*b* may be portions of a single memory array 125. In some embodiments, the memory arrays 125*a*-*b* may be separate memory arrays. In some embodiments, each I/O lane L0-L7 may include a de-serializer to parallelize incoming data from the signal lines to provide to the memory arrays 125*a*-*b*.

The memory channel 100 may include a clock circuit 115. The clock circuit 115 may synthesize an internal clock signal and provide the internal clock signal to all of the CA lanes 110 and I/O lanes 105*a*-*b*. The internal clock signal may be provided to one or more components of the lanes, for example, the drivers and receivers. In some embodiments, a separate clock circuit 115 and/or internal clock signal may be provided for each CA lane [CA0-1] and each I/O lane [L0-7]. The separate clock circuits 115 may operate independently or in coordination with the clock circuits 115 of other lanes. In some embodiments, the separate clock signals may be synthesized independently or in coordination with the clock signals of other lanes by clock circuit 115. When separate clock circuits 115 and/or internal clock signals for each CA lane [CA0-1] and I/O lane [L0-7] operate independently, the timing of each lane may be independent. That is, each clock circuit 115 may generate a separate internal clock signal with a separate phases and/or frequencies. This may result in lane-to-lane skew and phase independence. The clock circuit 115 inside the memory channel 100 may reduce or eliminate the need for high speed clock trees for distributing an internal clock signal. This may reduce the power requirements of the memory channel 100 at higher internal clock frequencies.

In some embodiments, the clock circuit 115 receives an external clock signal (not shown). The external clock signal may be a system clock signal of a central processing unit or another component of a host device coupled to the memory channel 100. The clock circuit 115 inside the memory channel 100 may reduce or eliminate the need for increasing the frequency of an external clock signal when a higher internal clock signal is desired. The clock circuit 115 may synthesize an internal clock signal based, at least in part, on the received external clock signal. In some embodiments, the clock circuit 115 synthesizes an internal clock signal independent of an external clock signal, and the clock circuit 115 may not receive the external clock signal. For example, if the memory channel 100 utilizes an encoded I/O scheme, timing information may be encoded in data received from a host. The data from the host may be provided by one or more I/O lanes 105*a*-*b* and/or CA lanes 110 to the clock circuit 115. The clock circuit 115 may utilize the encoded timing data to synthesize the internal clock signal. Other methods of synthesizing an internal clock signal independent of an external clock signal may also be used. In some embodiments, the clock circuit 115 may generate an internal clock signal that may be a higher frequency than an external clock signal. In some examples, the internal clock signal is double the frequency of the external clock signal. The higher frequency internal clock signal may allow for at least some memory operations to be executed faster (e.g., I/O operations). In some embodiments, some memory operations may be executed at the same rate.

Although not shown, the memory channel 100 may include additional inputs and/or outputs. For example, the memory channel 100 may receive a clock enable signal, a chip select signal, an external clock signal, a ZQ/reset signal, and/or another control signal. The memory channel 100 may provide a status signal and/or another output signal to an external component (e.g. memory controller, host).

Figure 2:
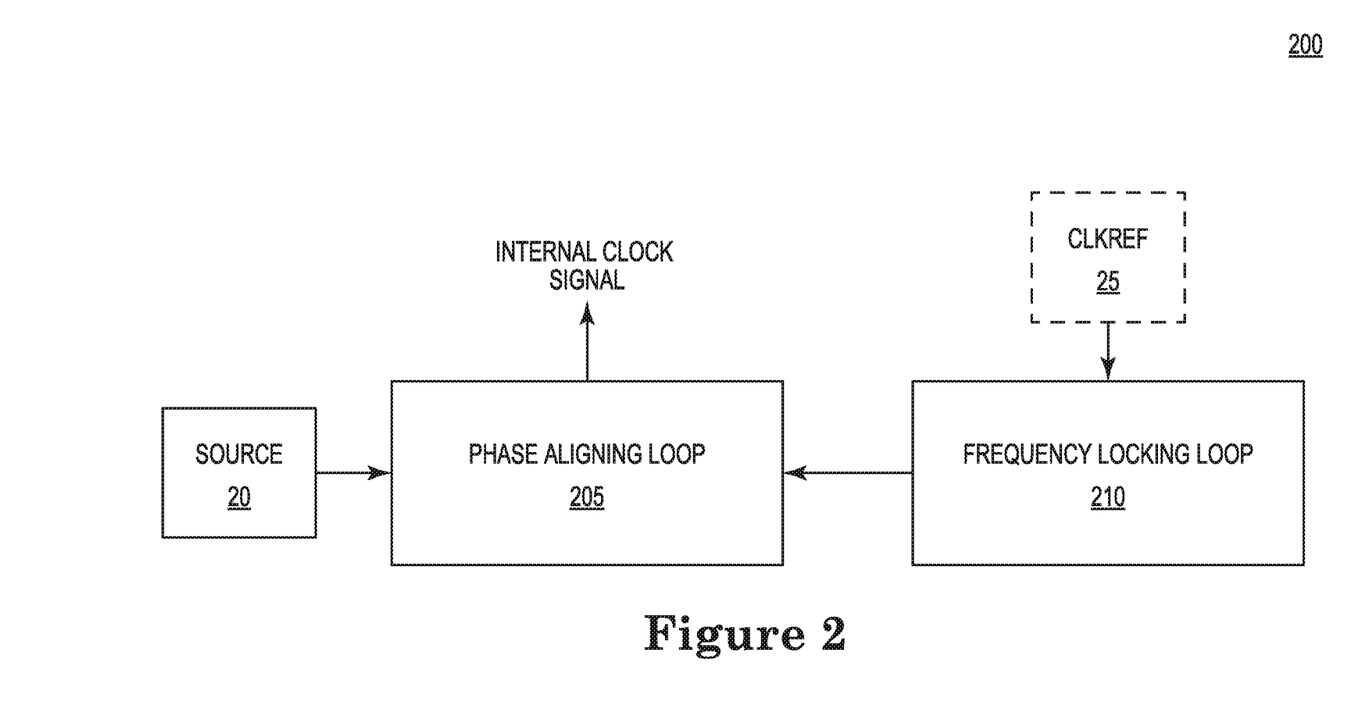
FIG. 2 is a block diagram of a clock circuit according to an embodiment of the disclosure.

FIG. 2 is a block diagram of a clock circuit 200 according to an embodiment of the disclosure. The clock circuit 200 may be used to implement clock circuit 115 shown in FIG. 1. The clock circuit 200 may include a phase-lock loop (PLL) in a dual-loop structure that synthesizes an internal clock signal. The clock circuit 200 may include a phase aligning loop 205 and a frequency locking loop 210. The phase aligning loop 205 may receive a data signal from a source, for example source 20. Source 20 may be an I/O lane, a CA lane, and/or another data signal source. The data signal may include a data stream, a data burst, a multi-bit training pattern, and/or other data. The phase aligning loop 205 may align a phase of a synthesized internal clock signal to the phase of the received data signal. In some embodiments, the phase and/or other timing information is encoded in the received data signal. In some embodiments, the phase aligning loop 205 may continuously align the phase of the internal clock signal to the data signal, when the data signal is provided. In some embodiments, the phase aligning loop 205 may align the phase of the internal clock signal to a training data signal from Source 20.

The frequency locking loop 210 may receive an external clock signal, for example, CLKRef 25. In some examples, the external clock signal may be the system clock of a host. The frequency locking loop 210 may synthesize an internal clock signal based, at least in part, on the received external clock signal. In some embodiments, the frequency locking loop 210 does not receive an external clock signal, and the frequency locking loop 210 synthesizes an internal clock signal with a frequency independent of the external clock signal. The frequency locking loop 210 may provide the synthesized internal clock signal to the phase aligning loop 205. The phase aligning loop 205, as described previously, may align the phase of the internal clock signal received from the frequency locking loop 210 to the phase of a data signal. The phase aligning loop 205 may then output the aligned internal clock signal. The internal clock signal may be provided to an I/O lane, a CA lane, and/or another component of the memory channel.

The clock circuit 200 may be implemented with analog components, digital components, and/or a combination thereof. In some embodiments, a separate phase aligning loop 205 is provided to each lane of a memory channel, such as I/O lanes 105*a*-*b* and CA lanes 110 of memory channel 100 of FIG. 1. The phase aligning loop 205 of each lane may receive an internal clock signal from a single frequency locking loop 210. In some embodiments, a separate frequency locking loop 210 may be provided for each half (e.g., 4-lanes of an 8-lane channel) of the memory channel. In some embodiments, a separate frequency locking loop 210 may be provided for each lane of the memory channel. In some embodiments, CA lanes of the memory channel may have a separate frequency locking loop 210 from the I/O lanes of the memory channel. Other configurations of the phase aligning loop 205 and the frequency locking loop 210 may be used.

Figure 3:
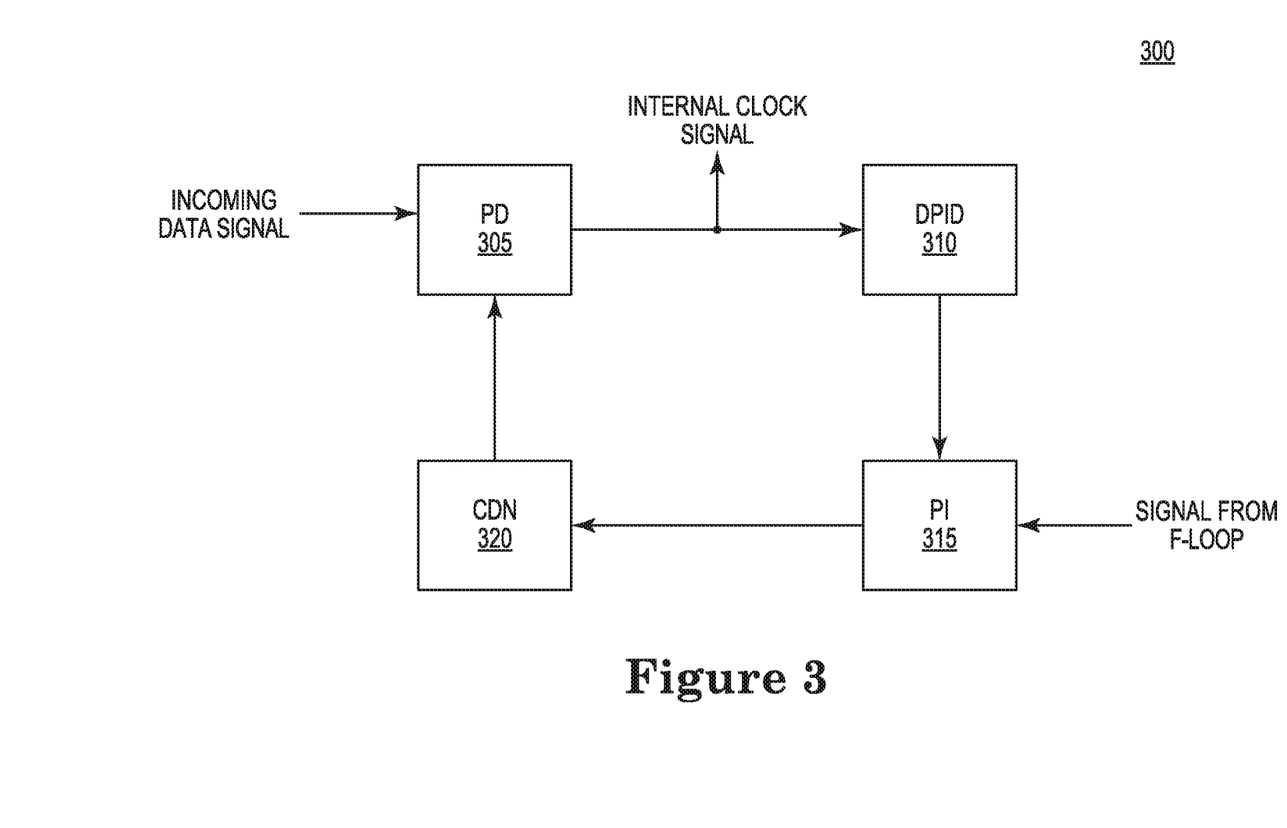
FIG. 3 is a block diagram of a phase aligning loop according to an embodiment of the disclosure.

FIG. 3 is a block diagram of a phase aligning loop 300 according to an embodiment of the disclosure. The phase aligning loop 300 may be used to implement the phase aligning loop 205 shown in FIG. 2. The phase aligning loop 300 may receive an incoming data signal at a phase detector 305. The phase detector 305 may sample the incoming data signal and extract the encoded timing information by detecting logic level transitions in the incoming data signal to detect the phase of the data. The phase detector 305 may also receive a timing signal from a clock distribution network (CDN) 320. The phase detector 305 may provide an internal clock signal to an I/O lane, a CA lane, and/or another component. The phase detector 305 may compare the phases of the incoming data signal and the timing signal from the CDN 320, and provide the result of the comparison to a digital proportional-integral derivative (DPID) 310 digital filter. The DPID 310 may act as a low-pass filter on the signal received from the phase detector 305. The filtered signal may be provided from the DPID 310 to a phase interpolator 315. The phase interpolator 315 may also receive a synthesized signal from an external source, such as a frequency locking loop, for example, frequency locking loop 210 shown in FIG. 2. The phase interpolator 315 may adjust the phase of the incoming synthesized signal based at least in part on the filtered signal received from the DPID 310. The phase interpolator 315 may provide the adjusted synthesized signal to the CDN 320. The CDN 320 may provide a delay of the adjusted synthesized signal to at least partially compensate for delays within the phase aligning loop 300 and/or a frequency locking loop. The CDN 320 may then provide the resulting timing signal to the phase detector 305. The CDN 320 may have lower power requirements compared to the high-speed clock trees typically used in memories.

Figure 4:
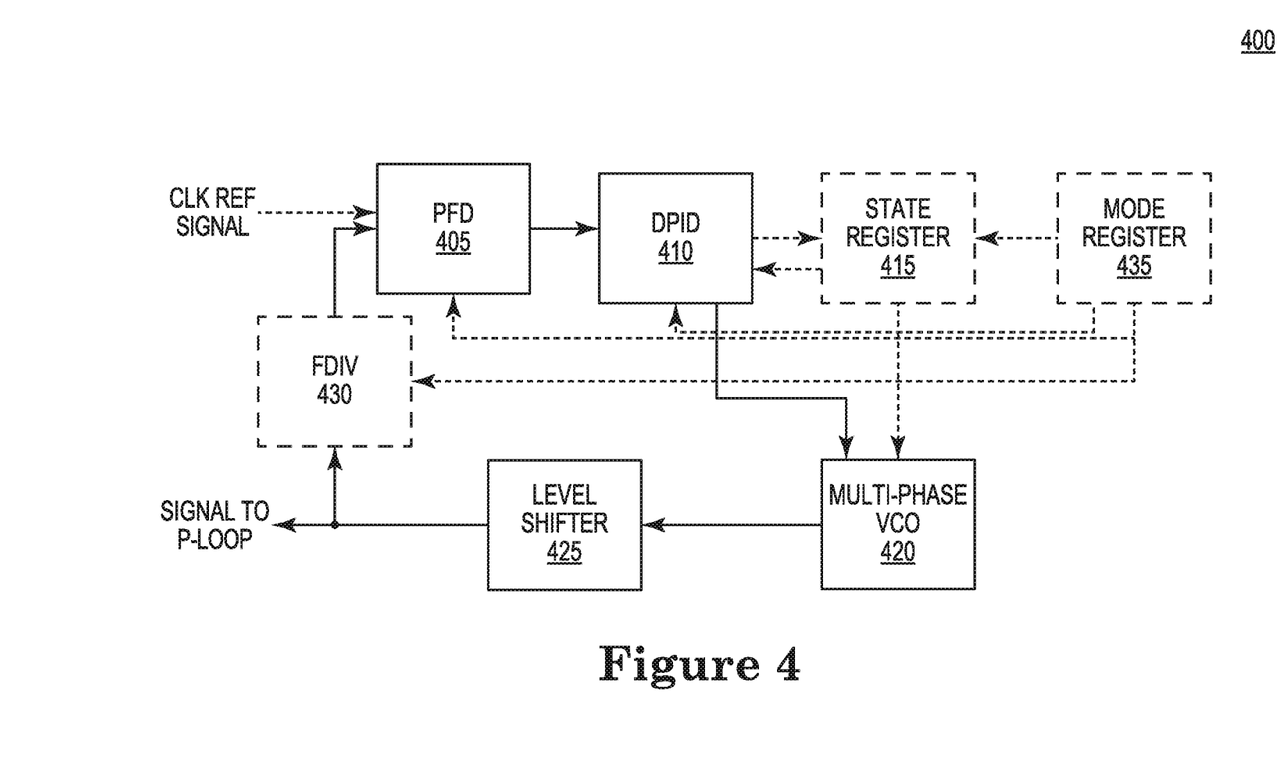
FIG. 4 is a block diagram of a frequency locking loop according to an embodiment of the disclosure.

FIG. 4 is a block diagram of a frequency locking loop 400 according to an embodiment of the disclosure. The frequency locking loop 400 may be used to implement the frequency locking loop 210 shown in FIG. 2. The frequency locking loop 400 may be a PLL configured for frequency synthesis. A phase frequency detector (PFD) 405 may optionally receive an external clock signal CLKRef in some embodiments. The external clock signal CLKRef may be a system clock signal from a host. The PFD 405 may also receive a divided signal from a frequency divider Fdiv 430. The PFD 405 may generate a signal proportional to the phase difference between the two input signals. The signal generated by the PFD 405 may be provided to a digital proportional-integral derivative (DPID) 410 digital filter that may act as a low-pass filter on the internal clock signal received from the PFD 405. Optionally, the filtered signal from the DPID 410 may be provided to a state register 415. The state register 415 may store information included in and/or related to the filtered signal. Storing the information in the state register 415 may allow the frequency locking loop 400 to lock the frequency faster when the frequency locking loop 400 is powered up again after a previous power down. For example, the state register 415 may provide filter parameters and/or other state control data to the DPID 410. The state register 415 may provide control signals and/or other state data to a voltage controlled oscillator 420, described in more detail below.

The filtered signal may be provided to a voltage controlled oscillator (VCO) 420. The VCO 420 may be a multi-phase VCO. The VCO 420 may synthesize a periodic signal with a phase and frequency based, at least in part, on the filtered signal received from the DPID 410. The synthesized signal by the VCO 420 may be provided to a level shifter 425. The level shifter 425 may adjust the synthesized signal from the VCO 420 to generate a clock signal having desired voltage levels. The level shifter 425 may provide compatibility between the voltage levels corresponding to various voltage levels by the VCO 420 and the voltages corresponding to various voltage levels by other components. In some embodiments, the level shifter 425 may be implemented as a current mode logic (CML)/complementary metal-oxide-semiconductor (CMOS) level shifter. The level shifter 425 may provide the synthesized signal to a phase aligning loop, such as phase aligning loop 300 illustrated in FIG. 3. The level shifter 425 may provide the synthesized signal to the frequency divider Fdiv 430. The frequency divider Fdiv 430 may divide the frequency of the synthesized signal and provide the divided signal to the PFD 405. The frequency divider Fdiv 430 may be configured to divide the frequency of the synthesized signal to provide an input to the PFD 405 that may allow the frequency locking loop 400 to generate a synthesized signal at a desired frequency. For some frequencies of the synthesized signal provided to the phase aligning loop, the frequency divider Fdiv 430 may be omitted. If the external clock signal CLKRef and/or other reference clock signal has a frequency at the desired frequency of the synthesized signal, the frequency divider Fdiv 430 may be omitted. If the external clock signal CLRef and/or other reference clock signal has a frequency lower than the desired frequency, the frequency divider Fdiv 430 may be configured to divide the frequency of the synthesized signal provided to the PFD 405. As a result, the frequency locking loop 400 may generate a synthesized signal at a multiple of the frequency of the external clock signal CLRef and/or other reference clock signal. For example, the Fdiv 430 may be configured to divide the frequency of the synthesized signal by two, which may result in a synthesized signal having a frequency twice that of the external clock signal CLRef.

In some embodiments, a mode register 435 may provide mode control signals to one or more components of the frequency locking loop 400. The mode register 435 may be programmed by a user, a host, a memory controller, and/or another memory component. The mode control signals, for example, may indicate the desired frequency of the synthesized signal, a divisor to frequency divider Fdiv 430, a state to store in the state register 415, a parameter of the low-pass filter of the DPID 410, and/or other operating parameters of the frequency locking loop 400. The mode control signals may be used to operate the frequency locking loop in a test and/or training mode. The mode register 435 may be located with the frequency locking loop 400 or in another portion of a clock circuit that includes the frequency locking loop 400, such as clock circuit 200 illustrated in FIG. 2. The mode register 435 may be located in a portion of a memory channel that includes the frequency locking loop 400, such as memory channel 100 illustrated in FIG. 1. In some embodiments, multiple mode registers may provide mode control signals to one or more components of the frequency locking loop 400. The multiple mode registers may be co-located or located with separate components of a clock circuit or a memory channel.

A memory channel including a clock circuit according to an embodiment of the disclosure may be trained by a training sequence. The training sequence may facilitate communication between the memory channel and a memory controller and/or host. The training sequence may allow a phase aligning loop of the clock circuit to align a phase of an internal clock signal to a training sequence prior to the receipt of data. The training sequence may allow a frequency locking loop to synthesize a clock signal at a desired frequency prior to the receipt of data. The training may reduce the lock time of the clock circuit incoming data.

Figure 5:
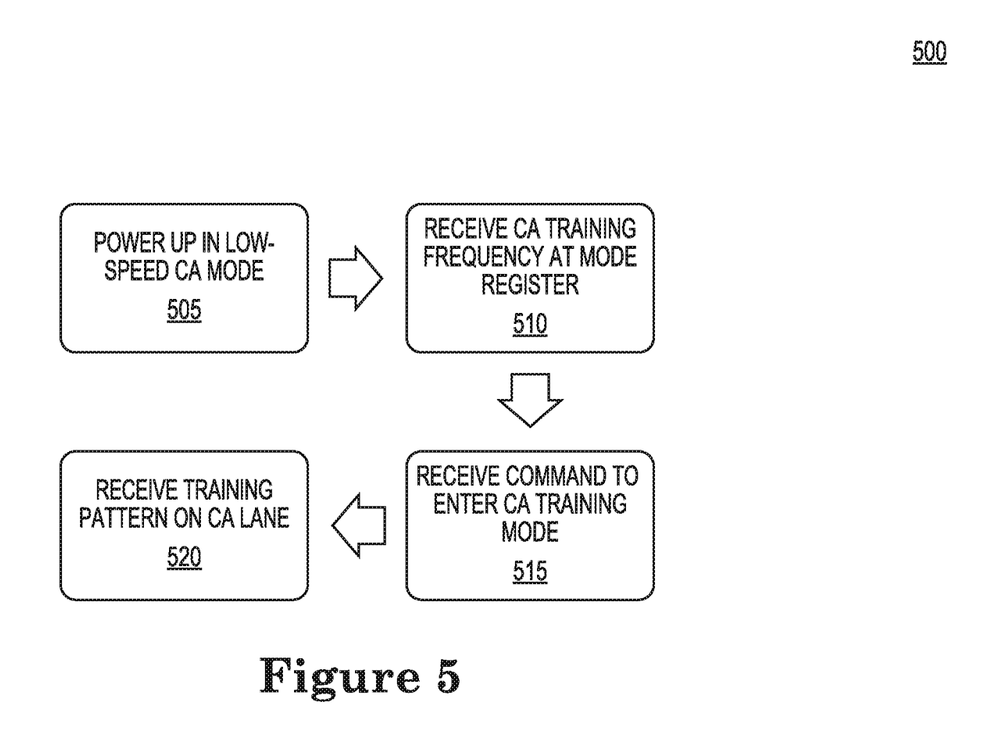
FIG. 5 is a flow chart of a training sequence according to an embodiment of the disclosure.

A flow chart of a training sequence 500 according to an embodiment of the disclosure is illustrated in FIG. 5. The training sequence may be performed on a memory channel, such as memory channel 100 illustrated in FIG. 1. The memory channel 100 may include one or more clock circuits as illustrated in FIGS. 2-4. At Step 505, the memory channel may power up in a low-speed CA mode. That is, the CA lane or lanes may receive commands and/or addresses at a frequency lower than the frequency the CA lanes operate at during normal operation of the memory channel. In some embodiments, the memory channel may power up in the low-speed CA mode based, at least in part, on receiving a clock enable signal. At Step 510, a mode register may receive a CA training frequency. The mode register may provide mode control signals to a clock circuit or circuits associated with the CA lane or lanes. The mode register may provide the CA training frequency to the clock circuit. The CA training frequency may indicate the frequency of a clock signal to be synthesized by the clock circuit during at least a portion of the training sequence. The memory channel may receive a command to enter a CA training mode at Step 515. The memory channel may then receive a training pattern on the CA lane or lanes at Step 520. The clock circuit or circuits may use encoded timing data from the training pattern to match the phase of a synthesized internal clock signal to the phase of the training pattern. The synthesized internal clock signal may have a frequency, based at least in part, on the CA training frequency received from the mode register. In some embodiments, the frequency of the synthesized internal clock signal may be based at least in part on a received system clock signal. In some embodiments, at Step 520 the memory receives the CA training pattern for a defined period of time. In some embodiments, the memory receives the CA training pattern until the memory provides a lock signal to indicate the clock circuit has locked the phase and frequency of the synthesized internal clock signal.

In some embodiments, all or some of Steps 505-520 may be optional. For example, the memory channel may already be in a powered up state, and Step 505 may be omitted. In some embodiments, a CA training frequency may already be stored in a mode register and/or the CA frequency is set by another method, and Step 510 may be omitted. In some embodiments, Steps 505-520 may be performed by the memory channel only at initial power up. In some embodiments, certain steps, for example Steps 515-520, may be repeated at regular intervals by the memory. This may allow for the clock circuit to adapt to changes in voltage, temperature, and/or other operating conditions.

Figure 6:
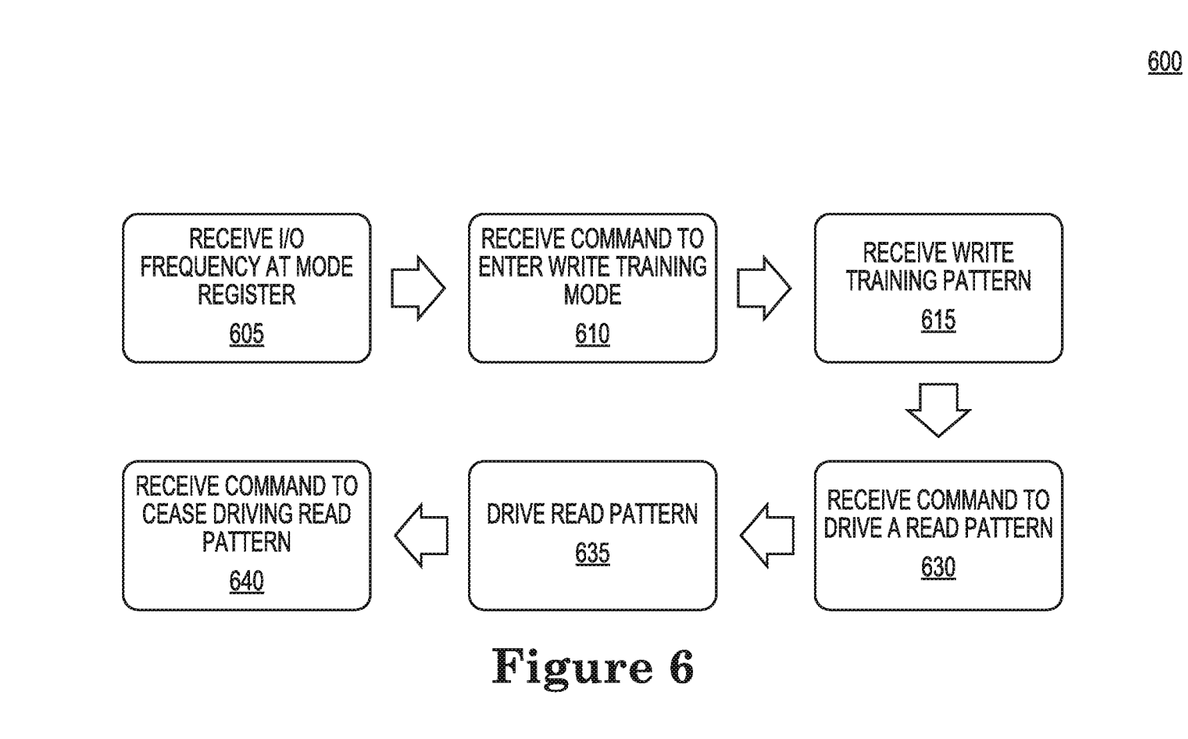
FIG. 6 is a flow chart of a training sequence according to an embodiment of the disclosure.

A flow chart of a training sequence 600 according to an embodiment of the disclosure is illustrated in FIG. 6. In some embodiments, the training sequence 600 may be performed after training sequence 500 shown in FIG. 5. The training sequence may be performed on a memory channel, such as memory channel 100 illustrated in FIG. 1. The memory channel 100 may include one or more clock circuits as illustrated in FIGS. 2-4. A mode register may receive an I/O frequency at Step 605. The mode register may be the same mode register described in reference to Step 510 illustrated in FIG. 5 or it may be a different mode register. The mode register may provide mode control signals to a clock circuit or circuits associated with an I/O lane or lanes. The clock circuit or circuits may be the same clock circuits associated with the CA lane or lanes of the memory channel or they may be different clock circuits. The mode register may provide the I/O frequency to the clock circuit or circuits associated with the I/O lanes. The memory may receive a command to enter a write training mode at Step 610. The memory may then receive a writing training pattern at Step 615. The clock circuit or circuits may use encoded timing data from the training pattern to match the phase of a synthesized internal clock signal to the phase of the training pattern. The synthesized internal clock signal may have a frequency, based at least in part, on the I/O training frequency received from the mode register. In some embodiments, the frequency of the synthesized internal clock signal may be based at least in part on a received system clock signal. In some embodiments, at Step 615 the memory receives the write training pattern for a defined period of time. In some embodiments, the memory receives the writing training pattern until the memory provides a lock signal to indicate the clock circuit has locked the phase and frequency of the synthesized internal clock signal.

The internal clock signal synthesized by the write training mode may be different than the internal clock signal synthesized by the CA training mode described in reference to FIG. 5. In some embodiments, each I/O lane and each CA lane may be associated with different internal clock signals. For example, as described previously in reference to FIG. 1, each I/O lane and each CA lane may be associated with a separate clock circuit.

In some embodiments, Steps 605-615 may be performed repeatedly without first repeating training sequence 500. For example, Steps 605-615 may be performed by the memory channel at regular intervals while training sequence 500 is only performed at an initial power up of the memory channel.

At Step 630, the memory channel may receive a command to drive a read pattern. The memory channel may drive a read pattern from a memory array or arrays through the I/O lane or lanes at Step 635. The read pattern may be received by a memory controller and/or a host device. The read pattern may utilize an encoded I/O scheme and include encoded timing data. In some embodiments, the read pattern provided by the memory channel may be used to calibrate one or more components external to the memory channel. At Step 640, the memory channel may receive a command to cease driving the read pattern. The training sequence 600 may then be complete. The memory channel may then enter a normal operation mode or another operation mode.

In some embodiments, Steps 630-640 may be performed repeatedly without first repeating Steps 605-615 and/or training sequence 500 illustrated in FIG. 5. For example, Steps 630-640 may be performed by the memory channel after a time period that included multiple write commands without any read commands. This may allow the memory controller and/or host to adjust to drift in the memory channel or in the memory controller and/or host.

In some embodiments, the memory channel may power up to a full-speed mode after training sequence 500. In some embodiments, the memory channel may power up to a full-speed mode only after training sequence 500 and training sequence 600 have been performed at least once after the initial power up. In some embodiments, the CA lane or lanes may switch from operating at the CA training frequency to a normal operation frequency after training sequence 500. In some embodiments, the CA training frequency may not switch to the normal operation frequency until after both training sequence 500 and training sequence 600 have been performed at least once after the initial power up.

Figure 7:
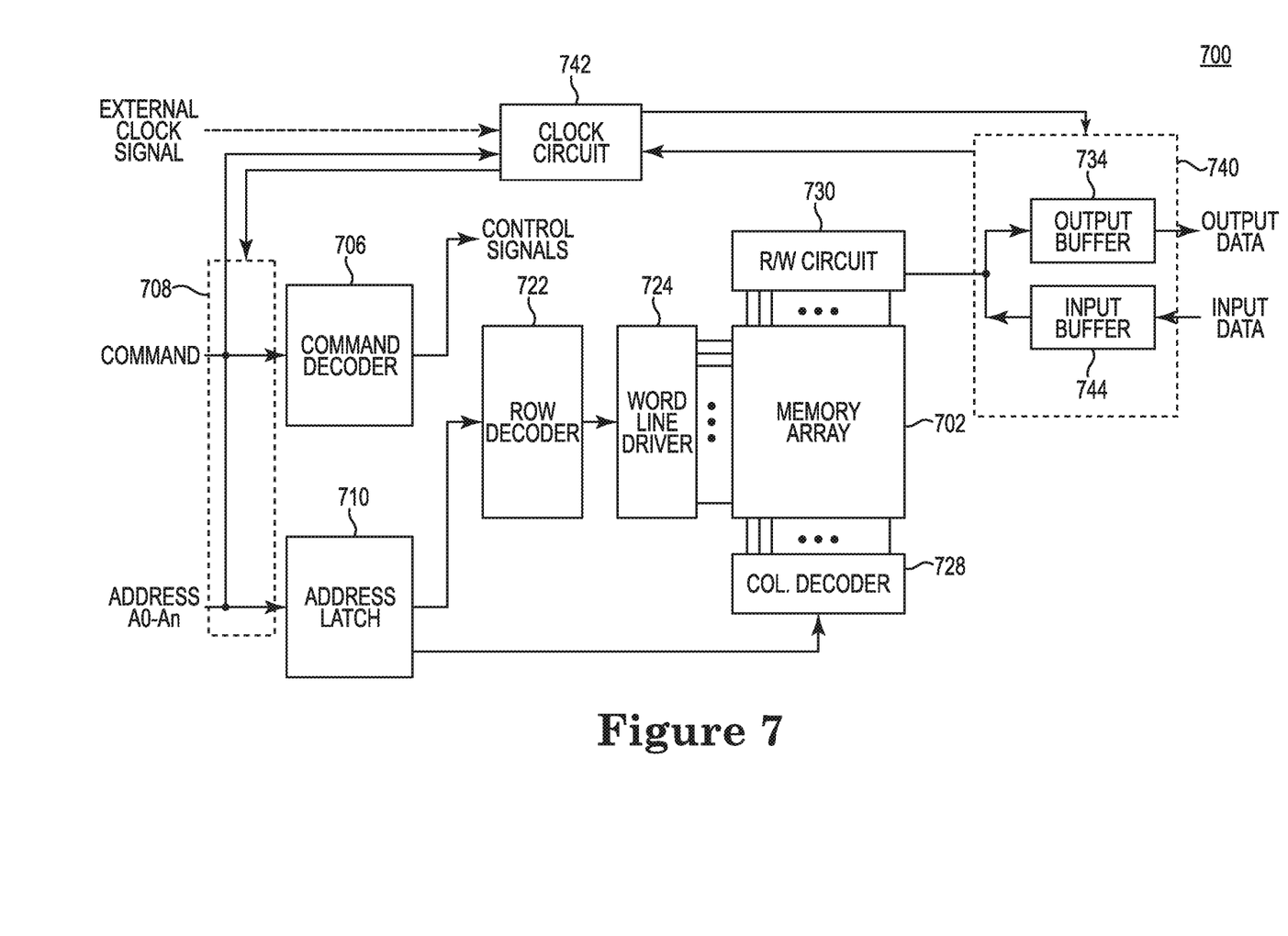
FIG. 7 is a block diagram of a portion of a memory according to an embodiment of the disclosure.

FIG. 7 is a block diagram of a portion of a memory 700 according to an embodiment of the disclosure. The memory 700 includes an array 702 of memory cells, which may be, for example, volatile memory cells (e.g., DRAM memory cells, SRAM memory cells, etc.), non-volatile memory cells (e.g., flash memory cells, PCM cells, etc.), or some other types of memory cells.

The memory 700 includes a command decoder 706 that receives memory commands through a command bus 708 and generates corresponding control signals within the memory 700 to carry out various memory operations. The command decoder 706 responds to memory commands applied to the command/address (CA) lane 708 to perform various operations on the memory array 702. For example, the command decoder 706 is used to generate internal control signals to read data from and write data to the memory array 702. Row and column address signals are applied to the memory 700 through the CA lane 708 and provided to an address latch 710. The address latch 710 then outputs a separate column address and a separate row address. In some embodiments, the address latch 710 may be included with the command decoder 706.

The row and column addresses are provided by the address latch 710 to a row address decoder 722 and a column address decoder 728, respectively. The column address decoder 728 selects bit lines extending through the array 702 corresponding to respective column addresses. The row address decoder 722 is connected to word line driver 724 that activates respective rows of memory cells in the array 702 corresponding to received row addresses. The selected data line (e.g., a bit line or bit lines) corresponding to a received column address are coupled to a read/write circuitry 730 to provide read data to a data output buffer 734 included in input-output (I/O) lane 740. Write data are applied to the memory array 702 through a data input buffer 744 included in I/O lane 740 and the memory array read/write circuitry 730. In some embodiments, the I/O lane 740 may include a plurality of output buffers 734 and input buffers 744.

The memory 700 may include a clock circuit 742. The clock circuit 742 may synthesize an internal clock signal and provide the internal clock signal to the CA lane 708 and/or I/O lane 740. The clock circuit 742 may receive data signals from the CA lane 708 and/or the I/O lane 740. The clock circuit 742 may adjust the phase of the internal clock signal to match the phase and/or frequency of the data signals received from the CA lane 708 and/or I/O lane 740. In some embodiments, the data signals may include encoded timing information. In some embodiments, the clock circuit 742 may receive an external clock signal. The clock circuit 742 may synthesize the internal clock signal with a phase and/or frequency based, at least in part, on the external clock signal. In some embodiments, the external clock signal is not received by the clock circuit 742, and the internal clock signal is synthesized independently of the external clock signal.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of operating a memory device, the method comprising:
   receiving, at a mode register coupled to a memory channel, a training frequency used to synthesize a clock signal;
   receiving at the memory channel a command to enter a training mode; and
   receiving, by the memory channel, a training pattern associated with the training mode used to match a phase of the synthesized clock signal.

2. The method of claim 1, wherein the training frequency comprises a command/address (CA) training frequency and the training mode comprises a CA training mode, the method further comprising:
   before the CA training frequency is received, powering up the memory channel in a low speed CA mode; and
   after the CA training frequency is received, receiving, by the memory channel, the command to enter the CA training mode.

3. The method of claim 1, further comprising synthesizing, by a clock circuit coupled to the memory channel, the clock signal during at least a portion of a training sequence associated with the training mode.

4. The method of claim 1, further comprising generating, by a clock circuit coupled to the memory channel, the synthesized clock signal based on the received training frequency.

5. The method of claim 1, further comprising matching, by at least one clock circuit, the phase of the synthesized clock signal to a phase provided by the training pattern, wherein the training pattern includes encoded timing data.

6. The method of claim 1, further comprising providing, by the mode register and to at least one clock circuit coupled to the memory channel, the training frequency to set a frequency of the clock signal to be synthesized by the at least one clock circuit.

7. The method of claim 1, further comprising
   setting a frequency of the synthesized clock signal to be the training frequency received from the mode register; and
   matching, by at least one clock circuit coupled to the mode register, the phase of the synthesized clock signal to a phase provided by the training pattern.

8. The method of claim 7, wherein the training pattern is provided to the memory channel until the frequency of the synthesized clock signal is locked by the at least one clock circuit.

9. The method of claim 7, wherein the training pattern is provided to the memory channel until the phase and the frequency of the synthesized clock signal are locked by the at least one clock circuit.

10. The method of claim 1, further comprising receiving, by a clock circuit coupled to the memory channel, a system clock signal,
    wherein the synthesized clock signal is an internal clock signal based at least in part on the received system clock signal.

11. An apparatus, comprising:
    a memory channel including a first circuit and a second circuit,
    the first circuit configured to receive a command/address (CA) training frequency during a low speed CA mode of the memory channel, and synthesize a clock signal based on the CA training frequency,
    the second circuit configured to receive a CA training pattern associated with the CA training mode used to match a phase of the synthesized clock signal to a phase of the CA training pattern.

12. The apparatus of claim 11, wherein the memory channel is configured to, before the CA training pattern is received by the second circuit, receive a command to enter a CA training mode.

13. The apparatus of claim 12, wherein the memory channel is configured to provide a signal to indicate the second circuit has locked the phase and the frequency of the synthesized clock signal.

14. The apparatus of claim 11, wherein the synthesized clock signal is a synthesized internal clock signal.

15. The apparatus of claim 11, wherein the memory channel is configured to receive the CA training pattern for a defined period of time.

16. The apparatus of claim 11, wherein the memory channel is configured to receive the CA training pattern until the second circuit has locked the phase and the frequency of the synthesized clock signal.

17. A method of operating a memory device, the method comprising:
- receiving, by a clock circuit coupled to a memory channel, an input/output (I/O) training frequency;
- receiving, by at least one I/O lane in the memory channel, a write training pattern; and
- driving, via the at least one IO lane, a read pattern after the write training pattern is received.

18. The method of claim 17, further comprising, after the receiving of the I/O training frequency, generating, by the clock circuit, a synthesized clock signal.

19. The method of claim 18, further comprising matching a phase of the synthesized clock signal to a phase provided by the received write training pattern.

20. The method of claim 17, further comprising, prior to the receiving of the write training pattern, receiving, by the memory channel, a command to enter an I/O training mode.

\* \* \* \* \*